(12) United States Patent
Park et al.

(10) Patent No.: US 11,171,096 B2
(45) Date of Patent: Nov. 9, 2021

(54) SEMICONDUCTOR PACKAGE

(71) Applicant: Samsung Electro-Mechanics Co., Ltd., Suwon-si (KR)

(72) Inventors: Seung Wook Park, Suwon-si (KR); Jae Chang Lee, Suwon-si (KR); Seong Hun Na, Suwon-si (KR); Jae Hyun Jung, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 40 days.

(21) Appl. No.: 16/655,284

(22) Filed: Oct. 17, 2019

(65) Prior Publication Data

US 2021/0035929 A1 Feb. 4, 2021

(30) Foreign Application Priority Data

Jul. 29, 2019 (KR) ........................ 10-2019-0091839

(51) Int. Cl.
*H01L 23/66* (2006.01)
*H03H 9/02* (2006.01)
*H03H 9/64* (2006.01)

(52) U.S. Cl.
CPC ......... *H01L 23/66* (2013.01); *H03H 9/02574* (2013.01); *H03H 9/6406* (2013.01)

(58) Field of Classification Search
CPC ................ H03H 9/54–589; H03H 9/02; H01L 23/34–4735
See application file for complete search history.

(56) References Cited

U.S. PATENT DOCUMENTS

| | | | | |
|---|---|---|---|---|
| 7,061,100 B2 * | 6/2006 | Iwaki | .................... | H01L 21/481 257/522 |
| 7,656,030 B2 * | 2/2010 | Osone | ..................... | H01L 23/34 257/728 |
| 9,035,535 B2 | 5/2015 | Yamashita | | |
| 9,444,428 B2 * | 9/2016 | Ruby | ................. | H03H 9/02102 |
| 10,516,381 B2 * | 12/2019 | Wainerdi | ............. | B81B 7/0051 |
| 2009/0152713 A1 * | 6/2009 | Sauciuc | ............. | H01L 23/3737 257/713 |
| 2018/0013404 A1 | 1/2018 | Kawasaki et al. | | |
| 2018/0130761 A1 * | 5/2018 | Kim | .................... | H01L 23/5389 |
| 2020/0235716 A1 * | 7/2020 | Eid | ........................ | H03H 9/542 |

FOREIGN PATENT DOCUMENTS

| | | | |
|---|---|---|---|
| JP | 5895016 B2 | 3/2016 | |
| KR | 10-2017-0092014 A | 8/2017 | |
| KR | 10-2018-0004776 A | 1/2018 | |

* cited by examiner

*Primary Examiner* — Dean O Takaoka
*Assistant Examiner* — Alan Wong
(74) *Attorney, Agent, or Firm* — NSIP Law

(57) ABSTRACT

A semiconductor package includes a main substrate, a resonator device disposed above the main substrate, a wiring portion connected to the resonator device, an electrical connection structure connected to the wiring portion and the main substrate, an encapsulant encapsulating the resonator device and the electrical connection structure, and a heat dissipation member bonded to and mounted on the resonator device. A cavity is provided in the resonator device, and is formed between the resonance portion and a resonator device substrate provided in the resonator device.

18 Claims, 13 Drawing Sheets

SEMICONDUCTOR PACKAGE

CROSS-REFERENCE TO RELATED APPLICATION

This application claims benefit under 35 USC § 119(a) of Korean Patent Application No. 10-2019-0091839 filed on Jul. 29, 2019 in the Korean Intellectual Property Office, the entire disclosure of which is incorporated herein by reference for all purposes.

BACKGROUND

1. Field

The following description relates to a semiconductor package.

2. Description of Related Art

A band-pass filter is a key component in communication devices, and selects only a signal within a determined frequency band from among various frequency bands to transmit and receive the selected signal.

Recently, for such a band-pass filter, an acoustic wave device has been widely used. In the acoustic wave device, a filter is generally implemented with an element having a thin film form that resonates a piezoelectric dielectric material deposited on a silicon wafer, and a semiconductor substrate. The bandpass filter may implement piezoelectric characteristics of the deposited piezoelectric dielectric material.

Examples of the acoustic wave device may include a surface acoustic wave (SAW) filter, a bulk acoustic wave (BAW) filter, as just examples.

A plurality of acoustic wave devices may be mounted on the substrate and implemented in a form of a module. Application fields of the acoustic wave device may include small and lightweight filters of mobile communications devices, chemical and biological devices, and similar devices, oscillators, acoustic resonance mass sensors, and the like.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a semiconductor package includes a main substrate, a resonator device disposed adjacent to a first surface of the main substrate, a wiring portion connected to the resonator device, an electrical connection structure connected to the wiring portion and the main substrate, an encapsulant encapsulating the resonator device and the electrical connection structure; and a heat dissipation member bonded to the resonator device, wherein a cavity is provided in the resonator device, and the cavity is formed between a resonance portion of the resonator device and a resonator device substrate provided in the resonator device.

The heat dissipation member may be mounted on the resonator device.

The resonator device may include the resonator device substrate, the resonance portion, and a cap that forms an internal space together with the resonator device substrate.

The resonance portion may be mounted on the resonator device substrate.

The heat dissipation member may be bonded to a first surface of the resonator device substrate, and is disposed adjacent to one of the main substrate and the wiring portion.

The resonator device may be connected to one of the wiring portion and the main substrate through a connection member.

The semiconductor package may include a dam that prevents the encapsulant from flowing into a space formed between the resonator device and the wiring portion.

The resonator device may include the resonator device substrate, the resonance portion, and a protective member forming an internal space together with the resonator device substrate.

A plurality of resonator devices may be disposed on the main substrate in parallel with each other.

The semiconductor package may include an electronic device mounted on the wiring portion.

The electrical connection structure may be connected to the main substrate through a connection member comprising one of a solder and a copper post.

One of the main substrate and the wiring portion may be provided with an inductor pattern that is connected to the resonator device.

The semiconductor package may include an inductor device connected to one of the main substrate and the wiring portion.

The main substrate may be provided with a first connection pad to which the electrical connection structure is connected, and the wiring portion may be provided with a second connection pad to which the electrical connection structure is connected.

In a general aspect, a semiconductor package includes a main substrate, a resonator device disposed adjacent to a first surface of the main substrate, a wiring member disposed on one surface of the resonator device to be connected to the resonator device, an electrical connection structure connected to the wiring member, an encapsulant encapsulating the resonator device and the electrical connection structure; and a heat dissipation member bonded to the resonator device and mounted on the resonator device, wherein the resonator device comprises a resonator device substrate, a resonance portion mounted on the resonator device substrate, and a cap that forms an internal space together with the resonator device substrate, an inductor pattern is embedded in the cap, and a cavity is formed between the resonance portion and the resonator device substrate.

The cap comprises an insulating layer, a connection conductor embedded in the insulating layer, the inductor pattern, and a protective member that forms an internal space in which the resonance portion is disposed, and wherein inductor pattern may extend from the connection conductor.

The connection conductor is connected to the wiring portion through a connection member.

The heat dissipation member may be bonded to a first surface of the resonator device substrate, and is disposed adjacent to the main substrate.

Other features and aspects will be apparent from the following detailed description, the drawings, and the claims.

Figure 1:
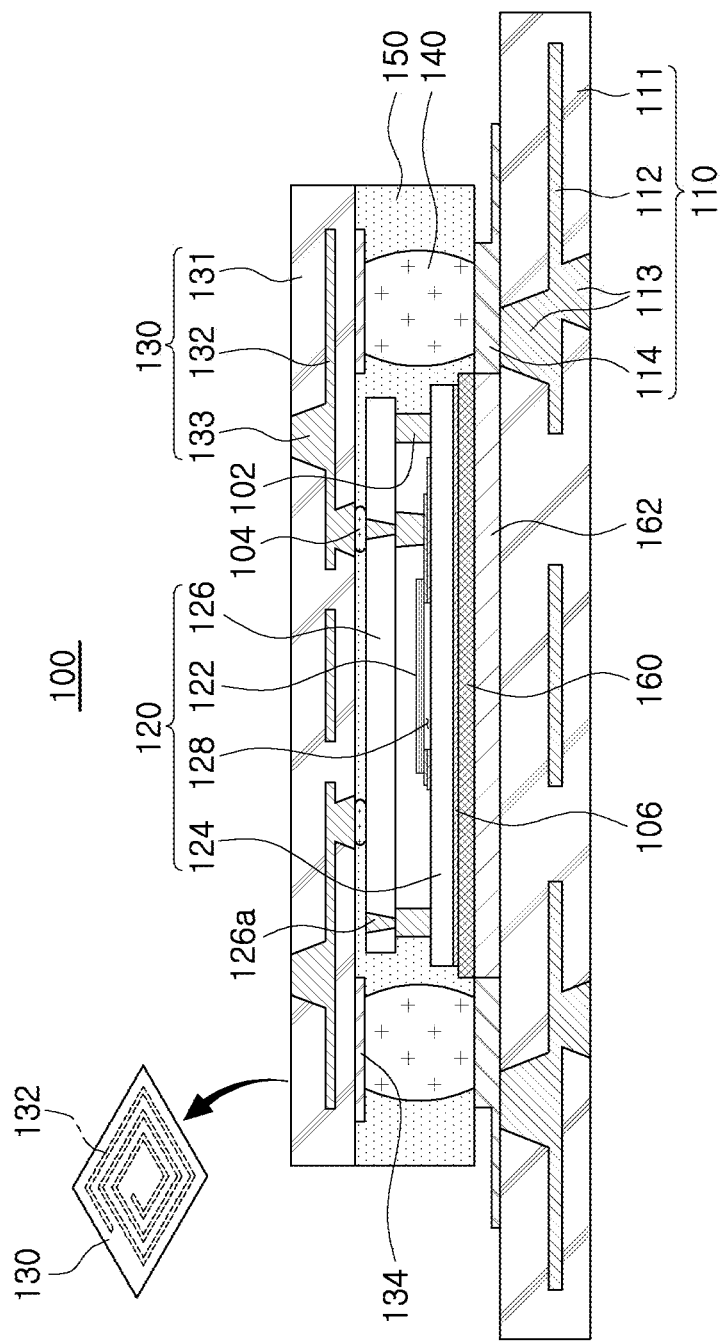
FIG. 1 is a schematic cross-sectional view of a semiconductor package according to an example.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The terminology used herein is for the purpose of describing particular examples only and is not to be limiting of the examples. As used herein, the singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which this disclosure pertains after an understanding of the present disclosure. It will be further understood that terms, such as those defined in commonly-used dictionaries, should be interpreted as having a meaning that is consistent with their meaning in the context of the relevant art and the present disclosure and will not be interpreted in an idealized or overly formal sense unless expressly so defined herein.

When describing the examples with reference to the accompanying drawings, like reference numerals refer to like constituent elements and a repeated description related thereto will be omitted. In the description of examples, detailed description of well-known related structures or functions will be omitted when it is deemed that such description will cause ambiguous interpretation of the present disclosure.

Hereinafter, examples will be described as follows with reference to the attached drawings.

FIG. 1 is a schematic cross-sectional view of a semiconductor package according to an example.

Referring to FIG. 1, a semiconductor package 100 according to an example may be configured to include, for example, a main substrate 110, a resonator device 120, a wiring portion 130, an electrical connection structure 140, an encapsulant 150, and a heat dissipation member 160.

The main substrate 110 may include a single crystal such as $LiTaO_3$, $LiNbO_3$, $Li_2B_4O_7$, $SiO_2$, silicon, as non-limiting examples. Additionally, the main substrate 110 may include a PZT-based polycrystalline or ZnO thin film. However, the main substrate 110 is not limited thereto, and may be replaced with various other substrates.

The main substrate 110 may be provided with a first insulating layer 111, a first wiring layer 112 disposed inside the first insulating layer 111, and a first via 113 connecting the first wiring layer 112. A top surface of the main substrate 110 may be provided with a first connection pad 114. The electrical connection structure 140 may have one end connected to the first connection pad 114. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The resonator device 120 may be disposed above the main substrate 110. As an example, the resonator device 120 may include a resonator device substrate 124, a resonator 122, mounted on the resonator device substrate 124, and a cap 126 coupled to the resonator device substrate 124 by a bonding member 102. A cavity 128 for resonance may be formed between the resonator device substrate 124 and the resonator unit 122.

In an example, the resonator device substrate 124 may be a silicon substrate. For example, a silicon wafer may be used as the resonator device substrate 124, or a silicon on insulator (SOI) type substrate may be used as the resonator device substrate 124. The resonator device substrate 124 and the cap 126 may be bonded by a bonding member 102. As an example, the bonding member 102 may be formed of a material including at least one of gold (Au), tin (Sn), chromium (Cr), titanium (Ti), and aluminum (Al).

As an example, the resonator 122 may include a lower electrode, a piezoelectric layer, and an upper electrode. The lower electrode, the piezoelectric layer, and the upper electrode may be sequentially laminated.

A plurality of vias 126a may be formed in the cap 126. The plurality of vias 126a may be electrically connected to the wiring portion 130 by means of the connection member 104. As an example, the connection member 104 may include a bump.

The wiring portion 130 may be disposed on one surface of the resonator device 120 to be connected to the resonator device 120. The wiring portion 130 may be provided with an inductor pattern 132 connected to the resonator device 120. As an example, the wiring portion 130 may include a second insulating layer 131, an inductor pattern 132 embedded in the second insulating layer 131, and a second via 133 connected to the inductor pattern 132.

As an example, the second insulating layer 131 may be formed of a magnetic material including a magnetic body to adjust inductance of the inductor pattern 132. The inductor pattern 132 may be formed to have a spiral shape. However, a shape of the inductor pattern 132 is not limited thereto, and the inductor pattern 132 may be formed to have various shapes, such as a helical shape, a meandering shape, as non-limiting examples, as long as it can provide inductance.

The wiring portion 130 may be provided with a second connection pad 134 connected to the other end of the electrical connection structure 140.

The wiring portion 130 may be connected to the electrical connection structure 140. As an example, one end of the electrical connection structure 140 may be connected to the first connection pad 114 of the main substrate 110, and the other end thereof may be connected to the second connection member 134 of the wiring portion 130.

As an example, the electrical connection structure 140 may be formed of a conductive material, for example, a solder. However, this is just an example and a material of the electrical connection structure 140 is not limited thereto. The electrical connection structure 140 may be a land, a ball, a pin, a bump, or similar element. The electrical connection structure 140 may formed to have, for example, a multilayer structure or a single-layer structure.

The encapsulant 150 may encapsulate the resonator device 120 and the electrical connection structure 140. As an example, the encapsulant 150 may protect the resonator device 120. The encapsulating form is not limited, and may be any form as long as it covers at least a portion of the resonator device 120. For example, the encapsulant 150 may cover at least a portion of the resonator device 120 and the electrical connection structure 140.

A detailed material of the encapsulant 150 is not limited and may be, for example, an insulating material. In an example, the insulating material may be a thermosetting resin such as an epoxy resin, a thermoplastic resin such as a polyimide resin, or a resin in which a reinforcement such as an inorganic filler is included in the above-described resins, such as an ABF, FR-4, BT, a photoimageable dielectric (PID) resin, and the like. Additionally, the insulating material may be a well-known molding material such as an EMC. As necessary, the insulating material may be a resin in which an insulating resin such as a thermosetting resin or a thermoplastic resin is impregnated in a core material such as an inorganic filler and/or a glass fiber (or a glass cloth or a glass fabric), and the like.

The heat dissipation member 160 may be disposed adjacent to the resonator device 120. As an example, the heat dissipation member 160 may be formed of a copper (Cu) material to easily transfer heat. The heat dissipation member 160 may be mounted on one surface of the resonator device 120 by virtue of the bonding material 106.

The heat dissipation member 160 may be disposed to be exposed from the encapsulant 150. For example, at least one surface of the dissipation member 160 may not be covered by the encapsulant 150. The heat dissipation member 160 may transfer heat to the main substrate 110 via a heat transfer layer 162. Thus, heat generated from the resonator device 120 may be transferred to the main substrate 110 through the heat dissipation member 160.

Accordingly, heat dissipation efficiency of the heat, generated from the resonator device 120, may be improved.

As described above, since the inductor pattern 132 may be provided in the wiring portion 130, and the inductor pattern 132 may be connected to the resonator device 120, inductance may be precisely controlled.

Additionally, since the heat dissipation member 160 may be directly connected to the main substrate 110, heat dissipation may be easily performed. For example, the heat dissipation member 160 may increase a heat transfer path to improve heat transfer efficiency.

Furthermore, since the resonator device 120 may be mounted on the main substrate 110 by a chip-last method, thinning of the resonator device 120 may be implemented.

Hereinafter, other examples will be described with reference to accompanying drawings.

Figure 2:
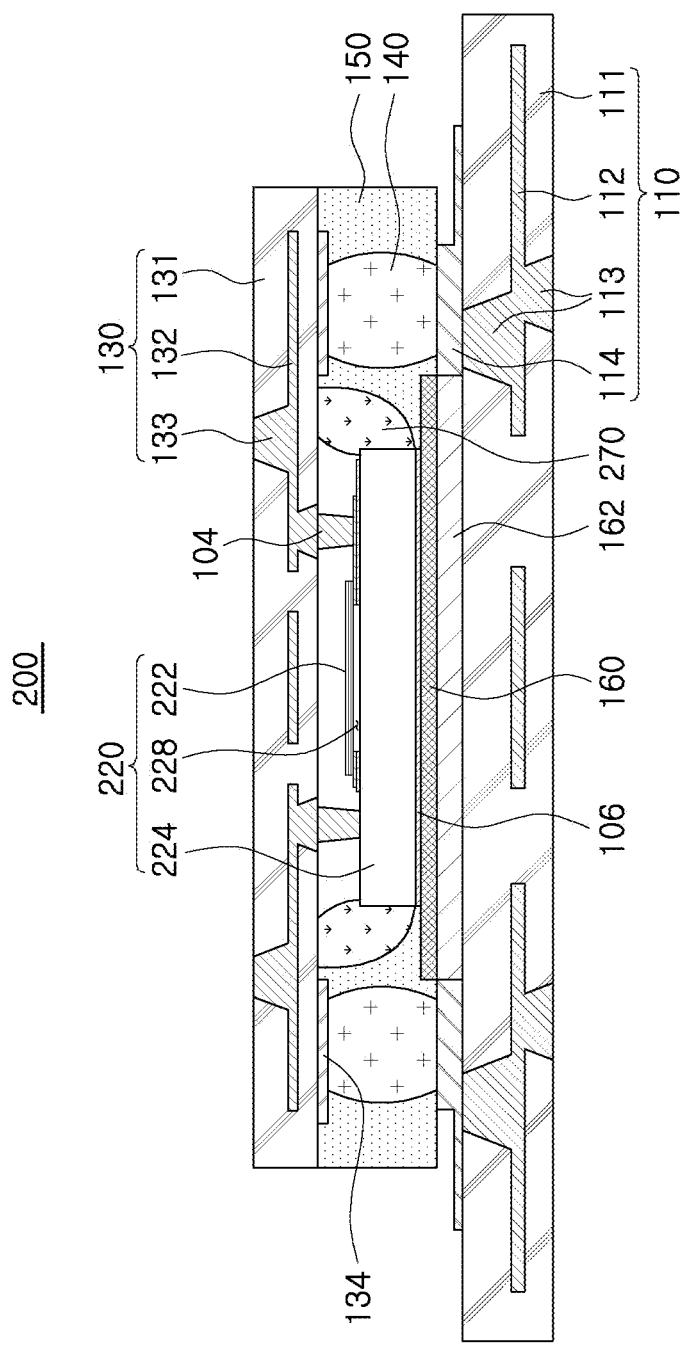
FIG. 2 is a schematic cross-sectional view of a semiconductor package according to an example.

FIG. 2 is a schematic cross-sectional view of a semiconductor package according to an example.

Referring to FIG. 2, a semiconductor package 200 according to an example may be configured to include, for example, a main substrate 110, a resonator device 220, a wiring portion 130, an electrical connection structure 140, an encapsulant 150, a heat dissipation member 160, and a dam 270.

Since the main substrate 110, the wiring portion 130, the electrical connection structure 140, the encapsulant 150, and the heat dissipation member 160 are the same as corresponding components described above, detailed descriptions thereof will be omitted and replaced with the above descriptions.

The resonator device 220 may be disposed above the main substrate 110. As an example, the resonator device 220 may include a resonator device substrate 224 and a resonator 222 mounted on the resonator device substrate 224. A cavity 228 for resonance may be formed between the resonator device substrate 224 and the resonator 222.

The resonator device substrate 224 may be a silicon substrate. For example, a silicon wafer or a silicon on insulator (SOI) type substrate may be used as the resonator device substrate 224. The resonator device substrate 224 and the wiring portion 130 may be connected through a connection member 104. The connection member 104 may be formed of a low melting-point material including a conductive material, for example, a solder. However, this is only an example and a material of the connection member 104 is not limited thereto. The connection member 104 may be a land, a ball, a pin, or the like. The connection member 104 may be formed to have a multilayer structure or a single-layer structure. When the connection member 104 may be formed to have a multilayer pattern, and may include a copper pillar and a solder, but is not limited thereto. When the connection member 104 is formed to have a single-layer structure, it may include a tin-silver solder or copper, but this is also merely an example and not limited thereto.

As an example, the resonator 222 may include a lower electrode, a piezoelectric layer, and an upper electrode. The lower electrode, the piezoelectric layer, and the upper electrode of the resonator 222 may be sequentially laminated.

As an example, the resonator device 220 may be connected to the wiring portion 130 via the connection member 104. The connection member 104 may be a land, a ball, a pin, a bump, or the like.

The dam 270 serves to prevent the encapsulant 150 from flowing into a space formed between the resonator device 220 and the wiring portion 130. As an example, the dam 270 may extend from a side surface of the resonator device substrate 224 to be in contact with the wiring portion 130. The dam 270 may be formed of a synthetic resin material such as epoxy, but is not limited thereto.

Figure 3:
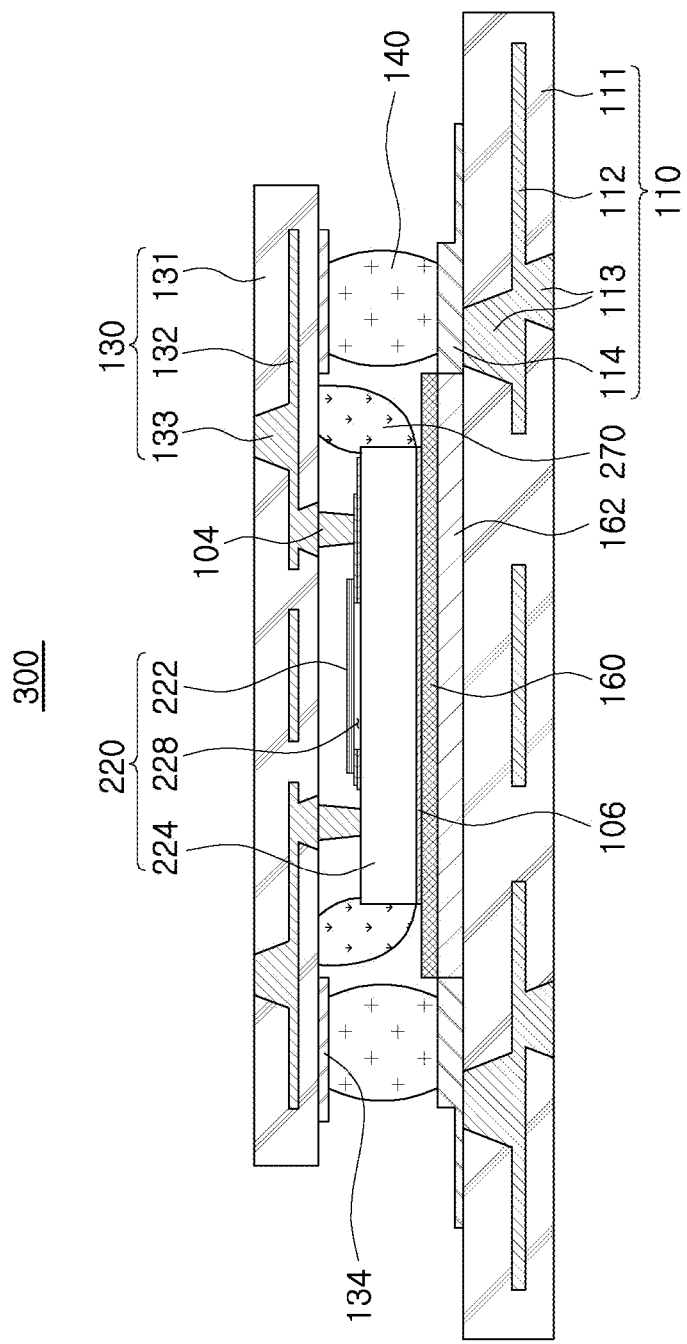
FIG. 3 is a schematic cross-sectional view of a semiconductor package according to an example.

FIG. 3 is a schematic cross-sectional view of a semiconductor package according to an example.

Referring to FIG. 3, a semiconductor package 300 according to an example may be configured to include, for example, a main substrate 110, a resonator device 220, a wiring portion 130, an electrical connection structure 140, a heat dissipation member 160, and a dam 270.

Since the main substrate 110, the wiring portion 130, the electrical connection structure 140, the heat dissipation member 160 are the same as components of the semiconductor package 100 according to the examples in FIGS. 1 and 2 above, and the resonator device 220 and the dam 270 are the same as corresponding components of the semiconductor package 200 according to the example in FIG. 2, detailed descriptions thereof will be omitted and replaced with the above descriptions.

The semiconductor package 300 according to an example may have a structure in which the encapsulant 150 of the semiconductor package 200 according to the example in FIG. 2 is omitted.

Figure 4:
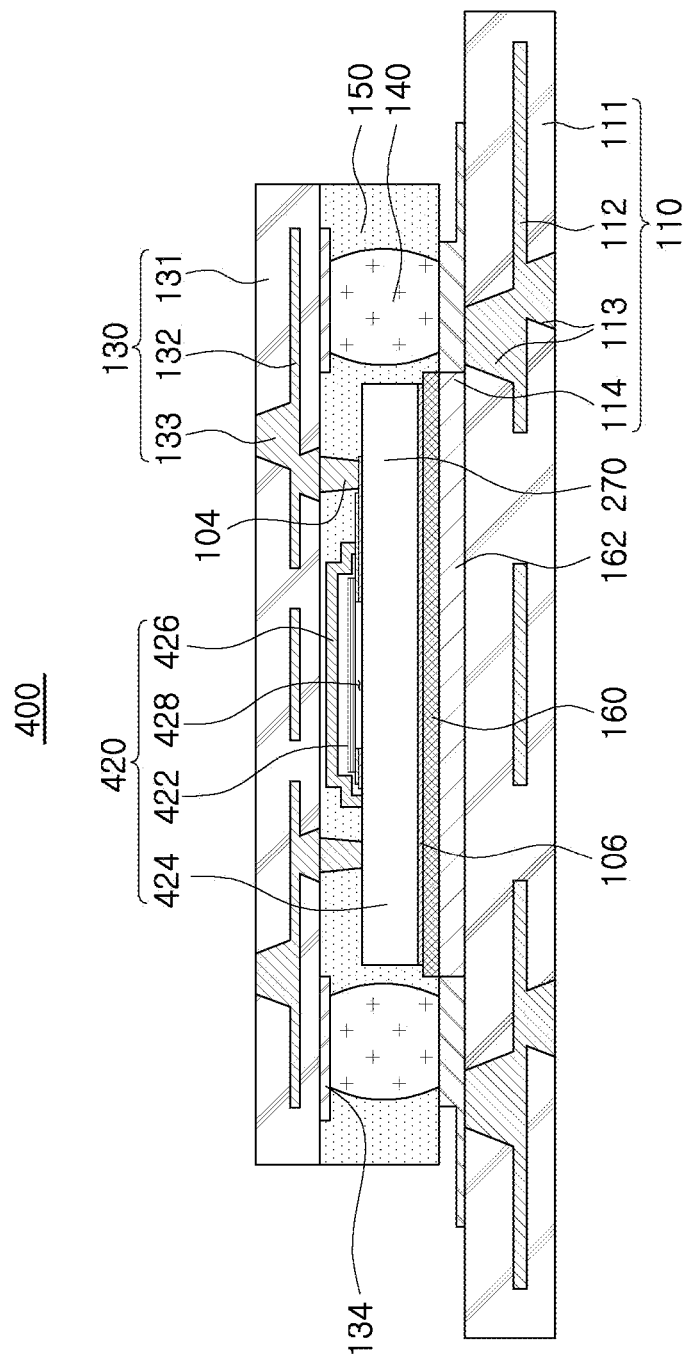
FIG. 4 is a schematic cross-sectional view of a semiconductor package according to an example.

FIG. 4 is a schematic cross-sectional view of a semiconductor package according to a fourth example.

Referring to FIG. 4, a semiconductor package 400 according to an example may be configured to include, for example, a main substrate 110, a resonator device 420, a wiring portion 130, an electrical connection structure 140, an encapsulant 150, and a heat dissipation member 160.

Since the main substrate 110, the wiring portion 130, the electrical connection structure 140, encapsulant 150, the heat dissipation member 160 are the same as corresponding components described above, detailed descriptions thereof will be omitted and replaced with the above descriptions.

The resonator device 420 is disposed above the main substrate 110. For example, the resonator device 420 may include a resonator device substrate 424, a resonator 422 mounted on the resonator device substrate 424, and a protective member 426 coupled to the resonator device substrate 424. A cavity 428 for resonance may be formed between the resonator device substrate 424 and the resonator 422.

The resonator device substrate 424 may be a silicon substrate. For example, a silicon wafer or a silicon on insulator (SOI) type substrate may be used as the resonator device substrate 424. However, the resonator device substrate is not limited thereto.

As an example, the resonator 422 may include a lower electrode, a piezoelectric layer, and an upper electrode. The lower electrode, the piezoelectric layer, and the upper electrode of the resonator 422 may be sequentially laminated.

A protective member 426 may be disposed to surround the resonator 422 and may form a closed space. Accordingly, the encapsulant 150 may not flow into the closed space. As an example, the protective member 426 may be formed of a synthetic resin material such as polymer or the like.

As an example, the resonator device 420 may be connected to the wiring portion 130 via the connection member 104. The connection member 104 may be a land, a ball, a pin, a bump, or the like.

Figure 5:
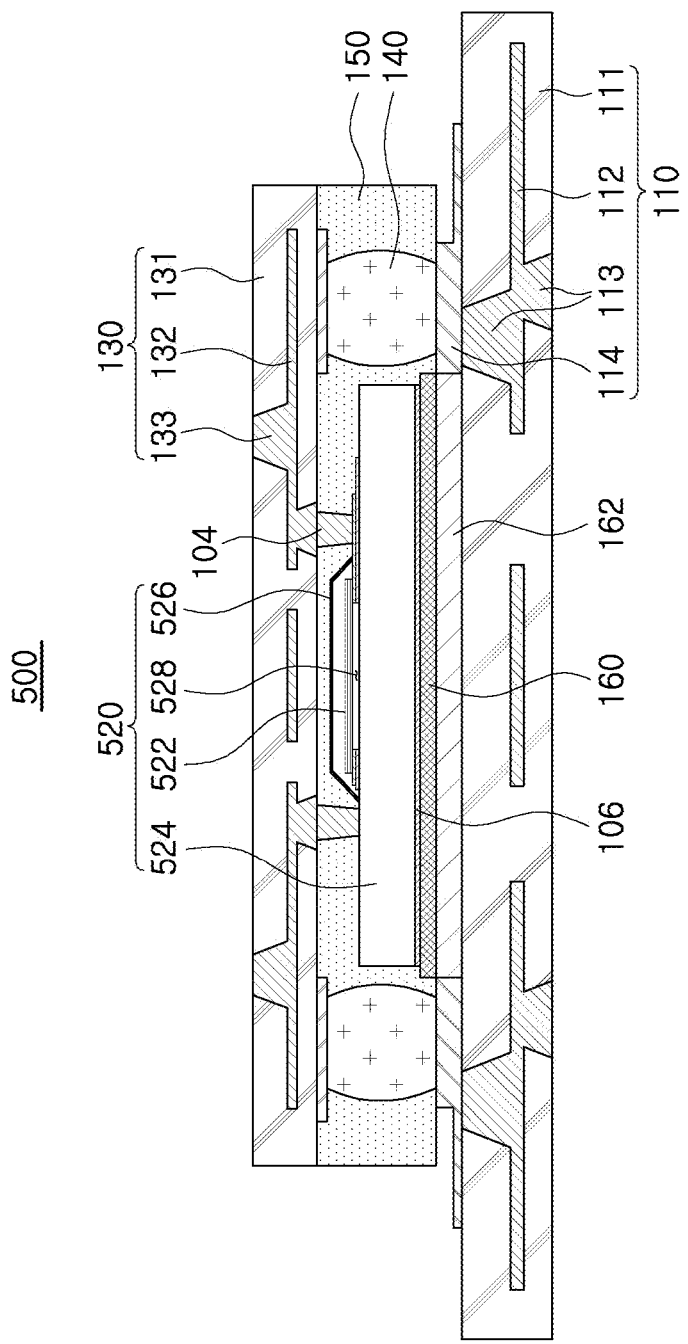
FIG. 5 is a schematic cross-sectional view of a semiconductor package according to an example.

FIG. 5 is a schematic cross-sectional view of a semiconductor package according to an example.

Referring to FIG. 5, a semiconductor package 500 according to an example may be configured to include, for example, a main substrate 110, a resonator device 520, a wiring portion 130, an electrical connection structure 140, an encapsulant 150, and a heat dissipation member 160.

Since the main substrate 110, the wiring portion 130, the electrical connection structure 140, the encapsulant 150, the heat dissipation member 160 are the same as corresponding components described above, detailed descriptions thereof will be omitted and replaced with the above descriptions.

The resonator device 520 is disposed above the main substrate 110. As an example, the resonator device 520 may include a resonator device substrate 524, a resonator 522 mounted on the resonator device substrate 524, and a protective member 526 coupled to the resonator device substrate 524. A cavity 528 for resonance may be formed between the resonator device substrate 524 and the resonator 522.

The resonator device substrate 524 may be a silicon substrate. For example, a silicon wafer or a silicon on insulator (SOI) type substrate may be used as the resonator device substrate 524.

As an example, the resonator 522 may include a lower electrode, a piezoelectric layer, and an upper electrode. The lower electrode, the piezoelectric layer, and the upper electrode of the resonator 522 may be sequentially laminated.

A protective member 526 may be disposed to surround the resonator 522 and may form a closed space. Accordingly, the encapsulant 150 may not flow into the closed space. As an example, the protective member 526 may include a non-conductive layer.

As an example, the resonator device 520 may be connected to the wiring portion 130 via the connection member 104. The connection member 104 may be a land, a ball, a pin, a bump, or the like.

Figure 6:
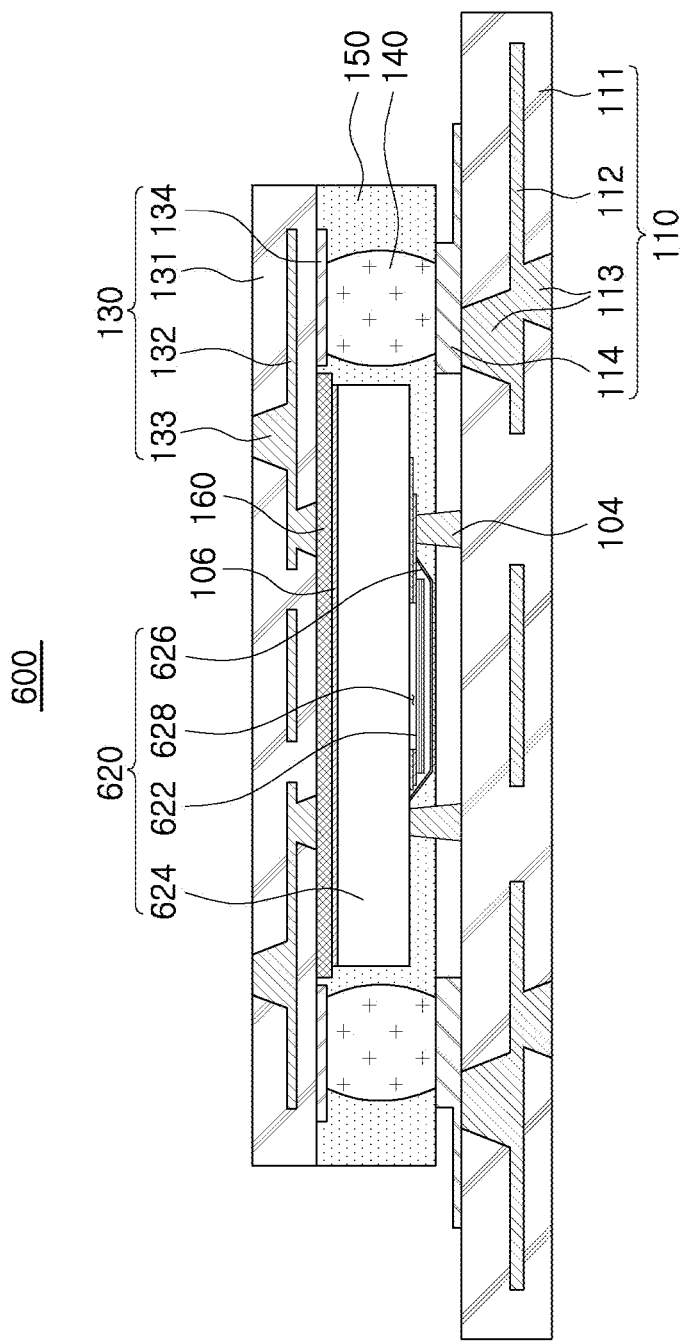
FIG. 6 is a schematic cross-sectional view of a semiconductor package according to an example.

FIG. 6 is a schematic cross-sectional view of a semiconductor package according to an example.

Referring to FIG. 6, a semiconductor package 600 according to an example may be configured to include, for example, a main substrate 110, a resonator device 620, a wiring portion 130, an electrical connection structure 140, an encapsulant 150, and a heat dissipation member 160.

Since the main substrate 110, the wiring portion 130, the electrical connection structure 140, the encapsulant 150, the heat dissipation member 160 are the same as corresponding components described above, detailed descriptions thereof will be omitted and replaced with the above descriptions.

The resonator device 620 is disposed above the main substrate 110. As an example, the resonator device 620 may include a resonator device substrate 624, a resonator 622 mounted on the resonator device substrate 624, and a protective member 626 coupled to the resonator device substrate 624. A cavity 628 for resonance may be formed between the resonator device substrate 624 and the resonator 622.

The resonator device substrate 624 may be a silicon substrate, but is not limited thereto. For example, a silicon wafer or a silicon on insulator (SOI) type substrate may be used as the resonator device substrate 624.

As an example, the resonator 622 may include a lower electrode, a piezoelectric layer, and an upper electrode. The lower electrode, the piezoelectric layer, and the upper electrode of the resonator 622 may be sequentially laminated.

A protective member 626 may be disposed to surround the resonator 622 and may form a closed space. Accordingly, the encapsulant 150 may not flow into the closed space. As an example, the protective member 626 may include a non-conductive layer.

The resonator device 620 may be disposed such that the resonator 622 faces the main substrate 110, and the heat dissipation member 160, mounted on one surface of the resonator device 620, may be disposed to be in contact with the wiring portion 130. Accordingly, heat, generated from the resonator device 620, may be transferred to the wiring portion 130 through the heat dissipation member 160. The heat, transferred to the wiring portion 130, may be transferred to the main substrate 110 through the electrical connection structure 140.

As an example, the resonator device 620 may be connected to the main substrate 110 via the connection member 104. The connection member 104 may be a land, a ball, a pin, a bump, or the like.

Figure 7:
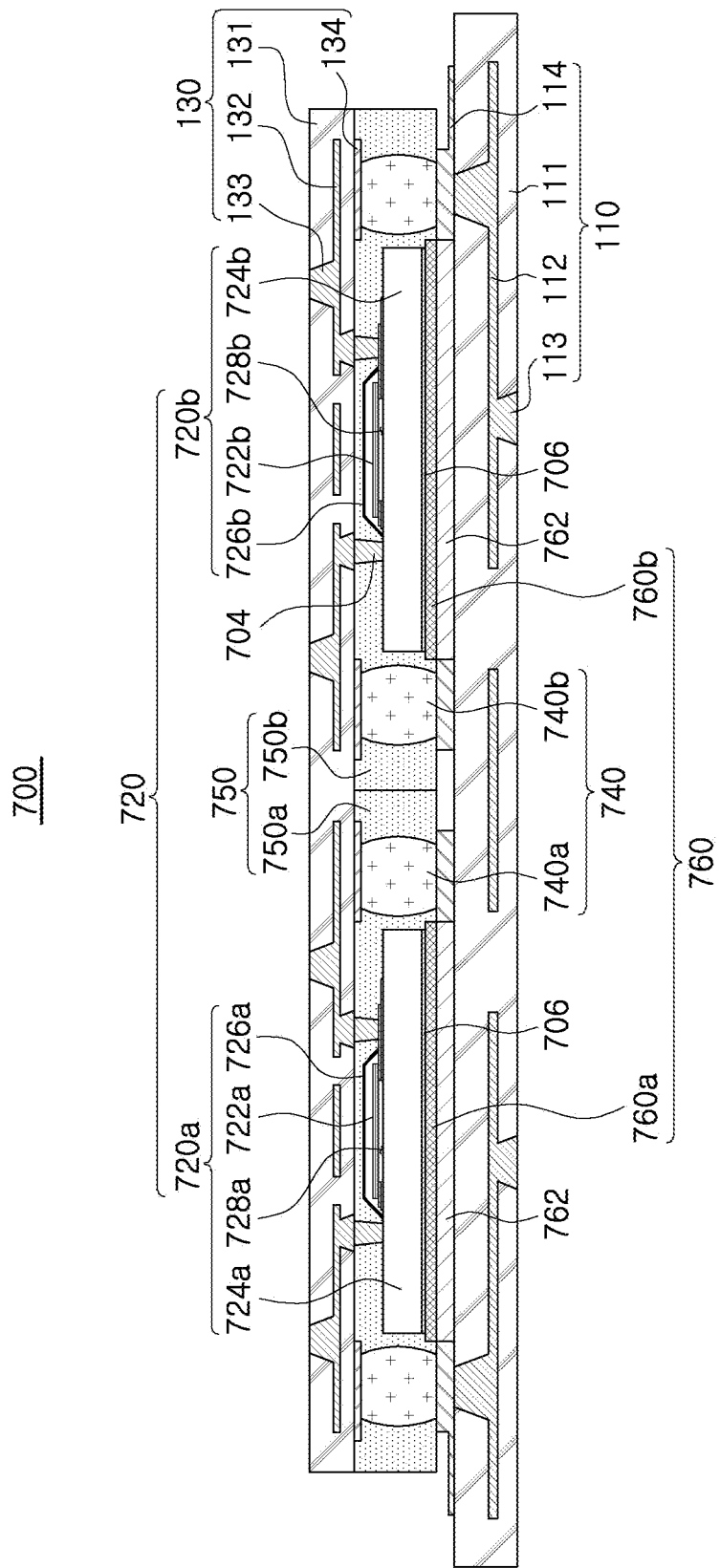
FIG. 7 is a schematic cross-sectional view of a semiconductor package according to an example.

FIG. 7 is a schematic cross-sectional view of a semiconductor package according to an example.

Referring to FIG. 7, a semiconductor package 700 according to an example may be configured to include, for example, a main substrate 110, a resonator device 720, a wiring portion 130, an electrical connection structure 740, an encapsulant 750, and a heat dissipation member 760.

Since the main substrate 110 and the wiring portion 130 are the same as corresponding components described above, detailed descriptions thereof will be omitted and replaced with the above descriptions.

The resonator device 720 may include a first resonator device 720a and a second resonator device 720b disposed parallel to the first resonator device 720a.

Since the first resonator device 720a and the second resonator device 720b are the same components, only the first resonator device 720a will be described herein.

The first resonator device 720a is disposed above the main substrate 110. For example, the first resonator device 720a may include a first resonator device substrate 724a, a first resonance portion 722a mounted on the first resonator device substrate 724a, and a first protective member 726a coupled to the first resonator device substrate 724a. A first cavity 728a for resonance may be formed between the first resonator device substrate 724a and the first resonance portion 722a.

In an example, the first resonator device substrate 724a may be a silicon substrate. For example, a silicon wafer or a silicon on insulator (SOI) type substrate may be used as the first resonator device substrate 724a.

As an example, the first resonator 722a may include a lower electrode, a piezoelectric layer, and an upper electrode. The lower electrode, the piezoelectric layer, and the upper electrode of the first resonator 722a may be sequentially laminated.

The first protective member 726a is disposed to surround the first resonator 722a, and forms a closed space. Accordingly, the encapsulant 750 may not flow into the closed space. As an example, the first protective member 726a may include a non-conductive film.

As an example, the first and second resonator devices 720a and 720b may be connected to the wiring portion 130 via the connection member 704. The connection member 704 may be a land, a ball, a pin, a bump, or the like.

The electrical connection structure 740 may be connected to the wiring portion 130. For example, one end of the electrical connection structure 740 may be connected to the first connection pad 114 of the main substrate 110, and the other end of the electrical connection structure 740 may be connected to the second connection member 134 of the wiring portion 130.

As an example, the electrical connection structure 740 may be formed of a conductive material, for example, a solder or the like, but this is only an example and a material of the electrical connection structure 740 is not limited thereto. The electrical connection structure 740 may be a land, a ball, a pin, a bump, or the like. The electrical connection structure 740 may be formed to have a multilayer structure or a single-layer structure.

The electrical connection structure 740 may include a first electrical connection structure 740a, disposed around the first resonator device 720a, and a second electrical connection 740b disposed around the second resonator device 720b.

The encapsulant 750 encapsulates the resonator device 720 and the electrical connection structure 740. As an example, the encapsulant 750 may protect the resonator device 720. The form of the encapsulation is not limited, and may be any form as long as the encapsulant 750 surrounds at least a portion of the resonator device 720. For example, the encapsulant 750 may cover at least a portion of the resonator device 720 and the electrical connection structure 740.

A detailed material of the encapsulant 750 is not limited and may be, for example, an insulating material. In this example, the insulating material may be, as non-limiting materials, a thermosetting resin such as an epoxy resin, a thermoplastic resin such as a polyimide resin, or a resin in which a reinforcement such as an inorganic filler is included in the above-described resins, such as an ABF, FR-4, BT, a photoimageable dielectric (PID) resin, and the like. Additionally, the insulating material may be a well-known molding material such as an EMC. As necessary, the insulating material may be a resin in which an insulating resin such as a thermosetting resin or a thermoplastic resin is impregnated in a core material such as an inorganic filler and/or a glass fiber (or a glass cloth or a glass fabric), and the like.

The encapsulant 750 may include a first encapsulant 750a, encapsulating the first resonator device 720a and the first electrical connection structure 740a, and a second encapsulant 750b encapsulating the second resonator device 720b and the electrical connection structure 740b.

The heat dissipation member 760 may be disposed adjacent to the resonator device 720. As an example, the heat dissipation member 760 may be formed of copper (Cu) material to facilitate heat transfer. The heat dissipation member 760 may be mounted on one surface of the resonator device 720 via the bonding material 706.

The heat dissipation member 760 may be disposed to be exposed from the encapsulant 750. The heat dissipation member 760 transfers heat to the main substrate 110 via the heat transfer layer 762. Accordingly, heat, generated from the resonator device 720, may be transferred to the main substrate 110 through the heat dissipation member 760.

Accordingly, heat dissipation efficiency of the heat, generated from the resonator device 720, may be improved.

The heat dissipation member 760 may include a first heat dissipation member 760a, connected to the first resonator device 720a, and a second heat dissipation member 760b connected to the second resonator device 720b.

Figure 8:
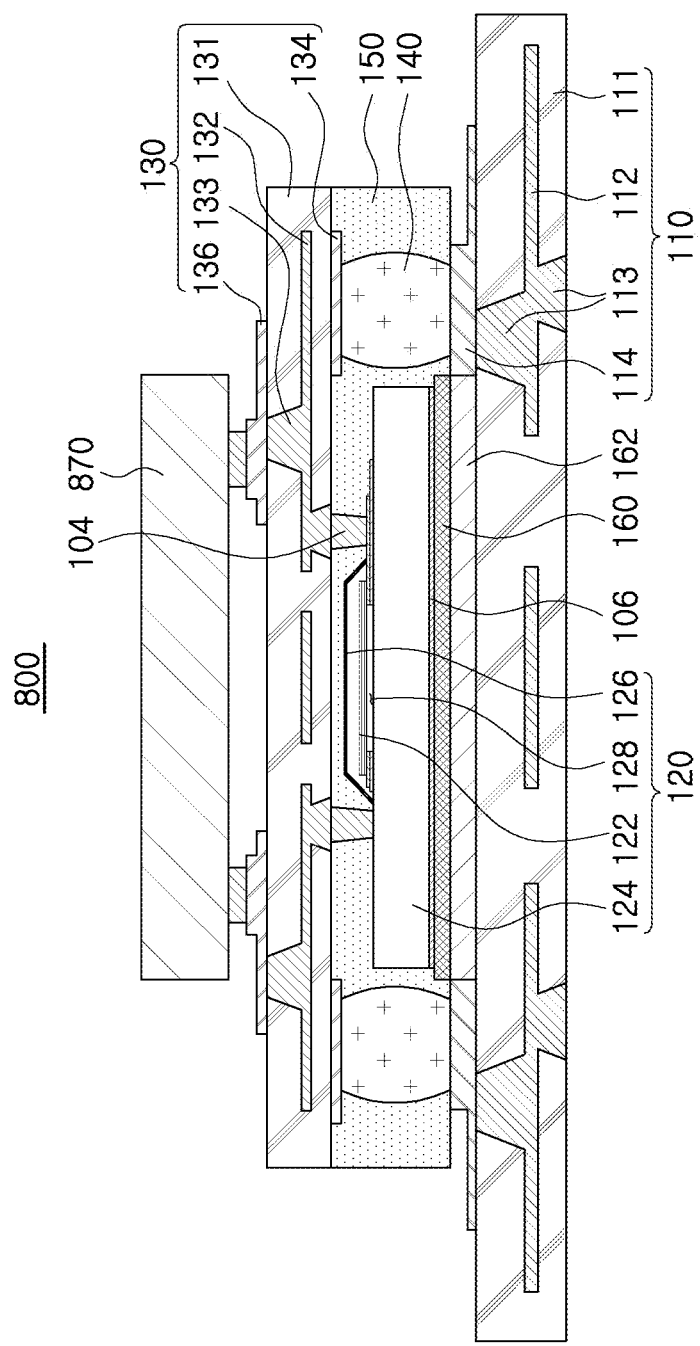
FIG. 8 is a schematic cross-sectional view of a semiconductor package according to an example.

FIG. 8 is a schematic cross-sectional view of a semiconductor package according to an example.

Referring to FIG. 8, a semiconductor package 800 according to an example may be configured to include, for example, a main substrate 110, a resonator device 120, a wiring portion 130, and an electrical connection structure 140, an encapsulant 150, a heat dissipation member 160, and an electronic device 870.

Since the main substrate 110, the resonator device 120, the wiring portion 130, the electrical connection structure 140, the encapsulant 150, the heat dissipation member 160 are the same as corresponding components described above, detailed descriptions thereof will be omitted and replaced with the above descriptions.

The electronic device 870 is connected to the third connection pad 136 provided on an upper surface of a wiring portion 130. The electronic device 870 may be, for example, any one of various devices such as an active device, a passive device, a resonator device, an inductor device, and the like.

Figure 9:
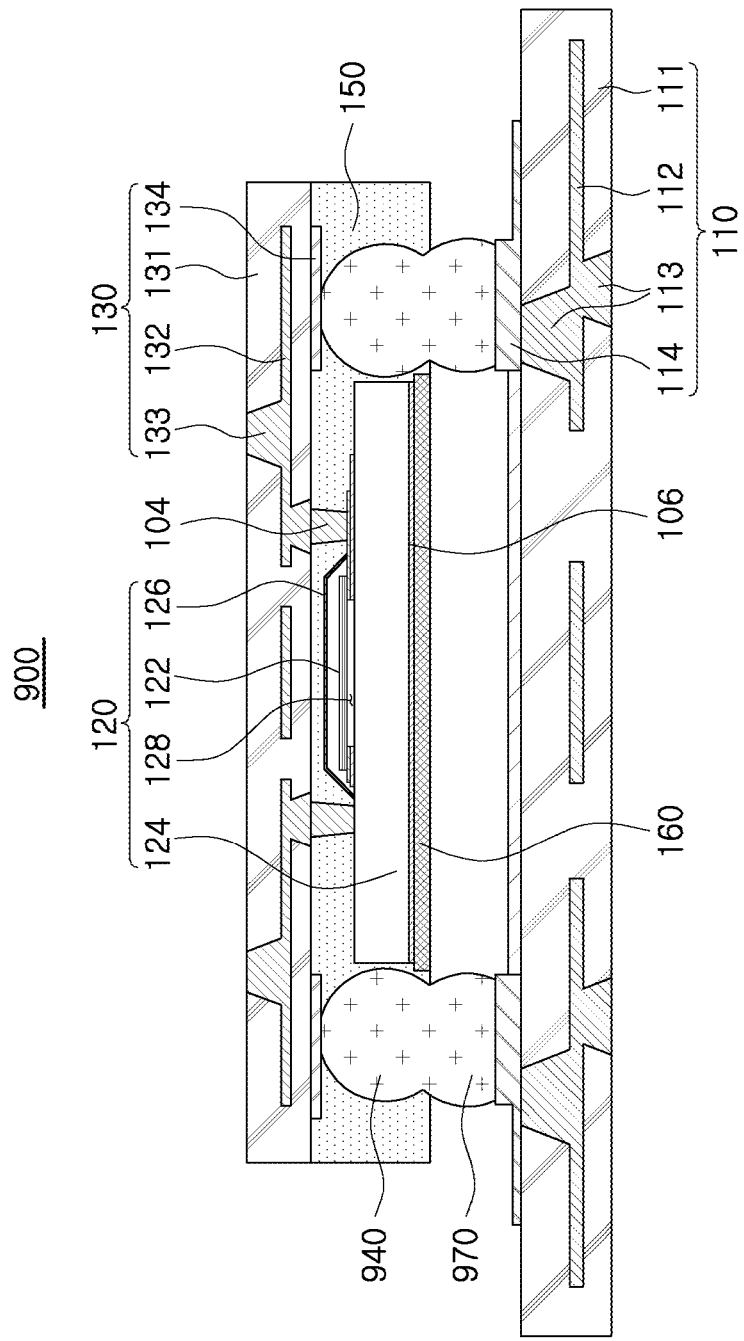
FIG. 9 is a schematic cross-sectional view of a semiconductor package according to an example.

FIG. 9 is a schematic cross-sectional view of a semiconductor package according to an example.

Referring to FIG. 9, a semiconductor package 900 according to an example may be configured to include, for example, a main substrate 110, a resonator device 120, a wiring portion 130, an electrical connection structure 940, an encapsulant 150, a heat dissipation member 160, and a connection member 970.

The electrical connection structure 940 is connected to the wiring portion 130. As an example, a first end of the electrical connection structure 940 may be connected to the second connection member 134 of the wiring portion 130, and a second end thereof may be connected to the connection member 970.

As an example, the electrical connection structure 940 may be formed of a conductive material, for example, a solder, but this is only an example and a material of the electrical connection structure 940 is not limited thereto. The electrical connection structure 940 may be a land, a ball, a pin, a bump, or the like. The electrical connection structure 940 may be formed to have a multilayer structure or a single-layer structure.

A first end of the connection member 970 may be connected to the electrical connection structure 940, and a second end thereof may be connected to the first connection pad 114 of the main substrate 110. As an example, the connection member 970 may include a solder or a copper post.

Accordingly, the heat dissipation member 960 may be spaced apart from the main substrate 110. For example, a space may be formed between the heat dissipation member 960 and the main substrate 110.

Figure 10:
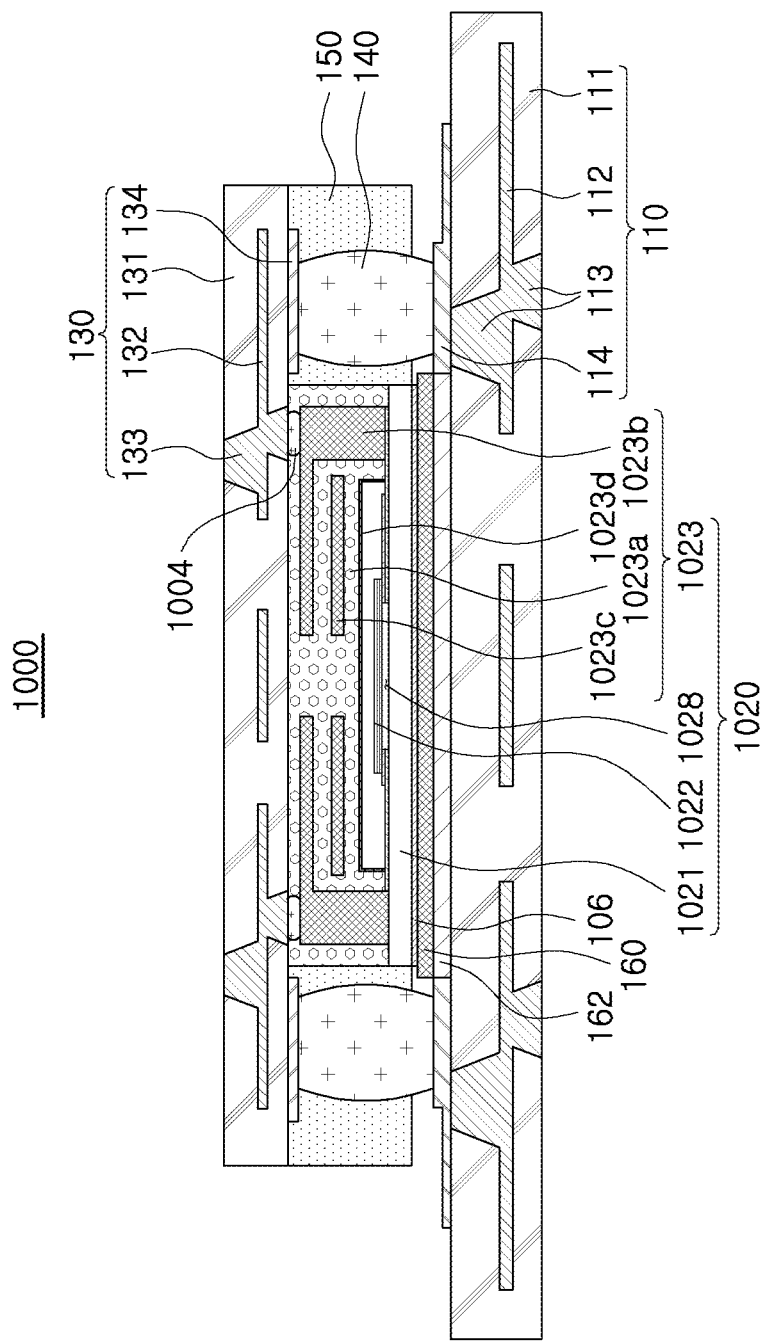
FIG. 10 is a schematic cross-sectional view of a semiconductor package according to an example.

FIG. 10 is a schematic cross-sectional view of a semiconductor package according to an example.

Referring to FIG. 10, a semiconductor package 1000 according to an example may be configured to include, for example, a main substrate 110, a resonator device 1020, a wiring portion 130, an electrical connection structure 140, an encapsulant 150, and a heat dissipation member 160.

Since the main substrate 110, the wiring portion 130, the electrical connection structure 140, the encapsulant 150, and the heat dissipation member 160 are the same as corresponding components described above, detailed descriptions thereof will be omitted and replaced with the above descriptions.

The resonator device 1020 is disposed above the main substrate 110. As an example, the resonator device 1020 includes a resonator device substrate 1021, on which the resonance portion 1022 is mounted, and a cap 1023 forming an internal space together with the resonator device substrate 1021. A cavity 1028 for resonance may be formed between the resonator device substrate 1021 and the resonance portion 1022.

The resonator device substrate 1021 may be a silicon substrate. For example, a silicon wafer or a silicon on insulator (SOI) type substrate may be used as the resonator device substrate 1021.

An insulating layer, not illustrated, may be formed on an upper surface of the resonator device substrate 1021, and may electrically isolate a configuration, disposed thereon, and the resonator device substrate 1021 from each other. The insulating layer serves to prevent the resonator device substrate 1021 from being etched by an etching gas when a cavity 1028 is formed in a manufacturing process.

In an example, the insulating layer may be formed of at least one of a silicon dioxide ($SiO_2$), a silicon nitride ($Si_3N_4$), an aluminum oxide ($Al_2O_3$), and an aluminum nitride (AlN), and may be formed by implementing any one of Chemical Vapor Deposition (CVD), radio-frequency (RF) magnetron sputtering, and evaporation.

The cap 1023 forms an internal space in which the resonance portion 1022 is disposed together with the resonator device substrate 1021. The cap 1023 includes an insulating layer 1023a, a connection conductor 1023b, embedded in the insulating layer 1023a, an inductor pattern 1023c and a resonator 1022, extending from the connection conductor 1023b, and a protective member for forming an internal space in which the resonance portion 1022 is disposed.

The insulating layer 1023a may serve to perform interlayer insulation and to protect the inductor pattern 1023c. A material of the insulating layer 1023a may be a thermosetting resin such as epoxy, a thermoplastic resin such as polyimide, a solder resist, a photocurable resin, or the like. In addition, a prepreg, in which such a resin impregnated with a reinforcing material such as a glass fiber or an inorganic filler, may be used to provide rigidity.

A magnetic material, including a magnetic body, may be used as the insulating layer 1023a to adjust inductance of the inductor pattern 1023c.

The connection conductor 1023b may be formed by filling a hole, penetrating through the insulating layer 1023a, with a conductive material or applying a conductive material on an internal surface of the hole. A conductive material of the connection conductor 1023 may be copper (Cu), silver (Ag), gold (Au), nickel (Ni), platinum (Pt), palladium (Pd), or alloys thereof, but is not limited thereto.

The connection conductor 1023b may be connected to the wiring portion 130 through the connection member 1004.

The inductor pattern 1023c may be disposed in the insulating layer 1023a. In this example, the inductor pattern 1023c may be formed in a spiral shape. Additionally, the inductor pattern 1023c may be formed in various shapes such as a helical shape, a meander shape, as non-limiting examples as long as it may provide inductance.

A plurality of inductor patterns 1023c may be provided. In this example, the plurality of inductor patterns 1023c may be connected to each other in parallel or in series. As an example, both ends of the inductor pattern 1023c may be connected to the connection conductor 1023a.

The protective member 1023d is disposed to surround the resonator 1022 and forms a closed space. Accordingly, the insulating layer 1023a may not flow into the closed space. As an example, the protective member 1023d may include a non-conductive film.

Figure 11:
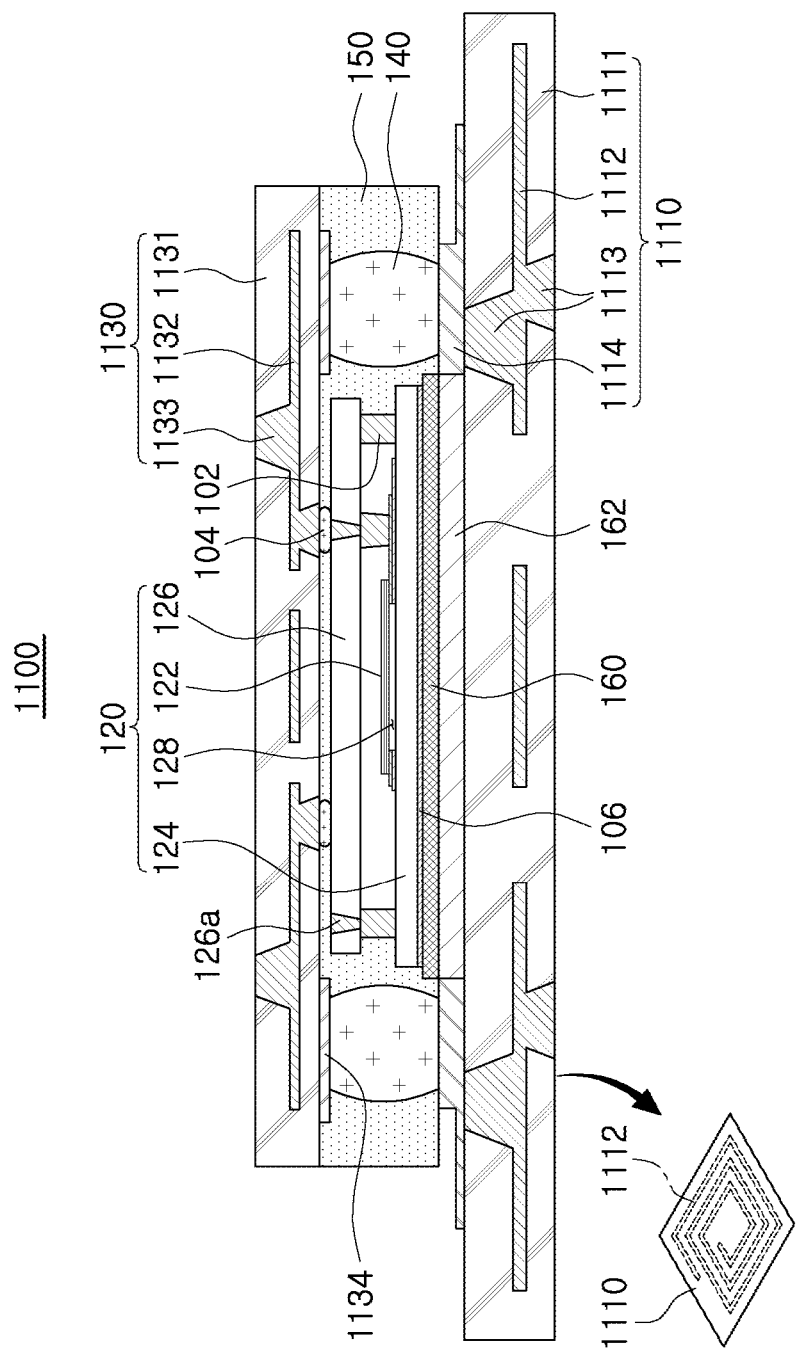
FIG. 11 is a schematic cross-sectional view of a semiconductor package according to an example.

FIG. 11 is a schematic cross-sectional view of a semiconductor package according to an example.

Referring to FIG. 11, a semiconductor package 1100 according to an example may be configured to include, for example, a main substrate 1110, a resonator device 120, a wiring portion 1130, an electrical connection structure 140, an encapsulant 150, and a heat dissipation member 160.

Since the resonator device 120, the electrical connection structure 140, the encapsulant 150, and the heat dissipation member 160 are the same as corresponding components described above, detailed descriptions thereof will be omitted and replaced with the above descriptions.

The main substrate 1110 may include a single crystal such as LiTaO$_3$, LiNbO$_3$, Li$_2$B$_4$O$_7$, SiO$_2$, silicon, or the like. Additionally, the main substrate 1110 may include a PZT-based polycrystalline or ZnO thin film. However, the main substrate 1110 is not limited to this example and may be replaced with various substrates.

The main substrate 1110 includes a first insulating layer 1111, an inductor pattern 1112, embedded in the first insulating layer 1111, and a first via 1113 connected to the inductor pattern 1112. As an example, the first insulating layer 1111 may be formed of a magnetic material including a magnetic body to adjust inductance of the inductor pattern 1112. In an example, the inductor pattern 1112 may be formed in a spiral shape. However, a shape of the inductor pattern 1112 is not limited thereto, and the inductor pattern 1112 may be formed in various shapes such a helical shape, a meander shape, as examples as long as it may provide inductance.

A first connection pad 1114 may be provided on an upper surface of the main substrate 1110. One end of the electrical connection structure 140 may be connected to the first connection pad 1114.

The wiring portion 1130 is disposed on one surface of the resonator device 120 to be connected to the resonator device 120. As an example, the wiring portion 1130 may include a second insulating layer 1131, a wiring layer 1132 disposed inside the second insulating layer 1131, and a second via 1133 connecting the wiring layer 1132. A second connection pad 1134 may be provided in the wiring portion 1130. One end of the electrical connection structure 140 may be connected to the second connection pad 1134.

Figure 12:
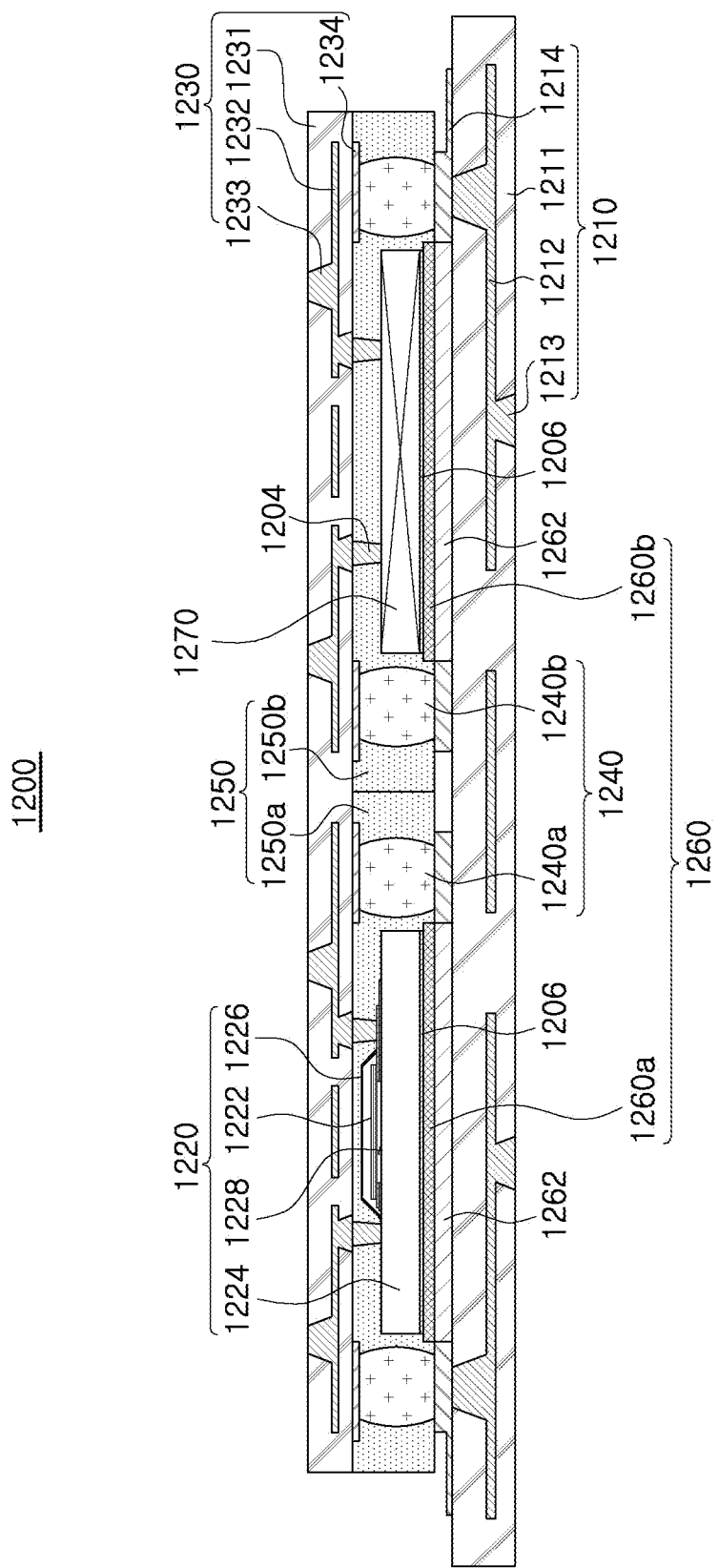
FIG. 12 is a schematic cross-sectional view of a semiconductor package according to an example.

FIG. 12 is a schematic cross-sectional view of a semiconductor package according to an example.

Referring to FIG. 12, a semiconductor package 1200 according to an example may be configured to include, for example, a main substrate 1210, a resonator device 1220, a wiring portion 1230, an electrical connection structure 1240, an encapsulant 1250, a heat dissipation member 1260, and an inductor device 1270.

The main substrate 1210 may include a single crystal such as LiTaO$_3$, LiNbO$_3$, Li$_2$B$_4$O$_7$, SiO$_2$, silicon, or the like. In addition, the main substrate 1210 may include a PZT-based polycrystalline or ZnO thin film. However, the main substrate 1210 is not limited to this example and may be replaced with various substrates.

The main substrate 1210 may include a first insulating layer 1211, a first wiring layer 1212, disposed inside the first insulating layer 1211, and a first via 1213 connecting the first wiring layer 1212. A first connection pad 1214 may be provided on an upper surface of the main substrate 1210. One end of the electrical connection structure 1240 may be connected to the first connection pad 1214.

The resonator device 1220 is disposed above the main substrate 1210. As an example, the resonator device 1220 may include a resonator device substrate 1224, a resonance portion 1222, mounted on the resonator device substrate 1224, and a protective member 1226 coupled to the resonator device substrate 1224. A cavity 1228 for resonance may be formed between the resonator device substrate 1224 and the resonator 1222.

In an example, resonator device substrate 1224 may be a silicon substrate. For example, a silicon wafer or a silicon on insulator (SOI) type substrate may be used as the resonator device substrate 1224.

As an example, the resonance portion 1222 may include a lower electrode, a piezoelectric layer, and an upper electrode. The lower electrode, the piezoelectric layer, and the upper electrode of the resonance portion 1222 may be sequentially laminated.

A protective member 1226 is disposed to surround the resonator portion 1222 and forms a closed space. Accordingly, the encapsulant 1250 may not flow into the closed space. As an example, the protective member 1226 may include a non-conductive layer.

As an example, the resonator device 1220 may be connected to the wiring portion 1230 via the connection member 1204. The connection member 1204 may be a land, a ball, a pin, a bump, or the like.

The wiring portion 1230 is disposed on one surface of the resonator device 1220 and is connected to the resonator device 1220. As an example, the wiring portion 1230 may include a second insulating layer 1231, a wiring layer 1232 disposed inside the second insulating layer 1231, and a second via 1233 connecting the wiring layer 1232. A second connection pad 1234 may be provided in the wiring portion 1230. An end of the electrical connection structure 1240 may be connected to the second connection pad 1234.

The electrical connection structure 1240 may be connected to the wiring portion 1230. As an example, a first end of the electrical connection structure 1240 may be connected to the first connection pad 1214 of the main substrate 1210, and a second end of the electrical connection structure 1240 may be connected to the second connection member 1234 of the wiring portion 1230.

As an example, the electrical connection structure 1240 may be formed of a conductive material, for example, a solder, but this is only an example and a material of the electrical connection structure 1240 is not limited thereto. The electrical connection structure 1240 may be a land, a ball, a pin, a bump, or the like. The electrical connection structure 1240 may be formed to have a multilayer structure or a single-layer structure.

The electrical connection structure 1240 may include a first electrical connection structure 1240a, disposed around the resonator device 1220, and a second electrical connection structure 1240b disposed around the inductor element 1270.

The encapsulant 1250 encapsulates the resonator device 1220, the electrical connection structure 1240, and the inductor device 1270. As an example, the encapsulant 1250 serves to protect the resonator device 720 and the inductor device 1270. The form of the encapsulation 1250 is not limited, and may be varied as long as it covers at least a portion of the resonator device 1220 and the inductor device 1270. For example, the encapsulant 1250 may cover at least a portion of the resonator device 1220 and the electrical connection structure 1240.

A material of the encapsulant 1250 is not limited and may be, for example, an insulating material. In an example, the insulating material may be a thermosetting resin such as an epoxy resin, a thermoplastic resin such as a polyimide resin, or a resin in which a reinforcement such as an inorganic filler is included in the above-described resins, such as an ABF, FR-4, BT, a photoimageable dielectric (PID) resin, and the like. Additionally, the insulating material may be molding material such as an EMC. As necessary, the insulating material may be a resin in which an insulating resin such as a thermosetting resin or a thermoplastic resin is impregnated in a core material such as an inorganic filler and/or a glass fiber (or a glass cloth or a glass fabric), and the like.

The encapsulant 1250 may include a first encapsulant 1250a, encapsulating the resonator device 1220 and the first electrical connection structure 1240a, and a second encapsulant 1250b encapsulating the inductor device 1270 and the second electrical connection structure 1240b.

The heat dissipation member 1260 is disposed adjacent to the resonator device 1220 and the inductor element 1270. As an example, the heat dissipation member 1260 may be formed of a copper (Cu) material to easily transfer heat. The heat dissipation member 1260 may be mounted on one surface of the resonator device 1220 and one surface of the inductor element 1270 via a bonding member 1206.

The heat dissipation member 1260 may be disposed to be exposed from the encapsulant 1250. The heat dissipation member 1260 transfers heat to the main substrate 1210 via the heat transfer layer 1262. Accordingly, heat, generated from the resonator device 1220 and the inductor element 1270, may be transferred to the main substrate 1210 via the heat dissipation member 1260.

Accordingly, heat dissipation efficiency of the heat, generated from the resonator device 1220 and the inductor element 1270, may be improved.

The heat dissipation member 1260 may include a first heat dissipation member 1260a, connected to the resonator device 1220, and a second heat dissipation member 1260b connected to the inductor element 1270.

The inductor element 1270 may be disposed parallel to the resonator device 1220, and may be electrically connected to the wiring portion 1230. As an example, the inductor element 1270 may be connected to the wiring portion 1230 via the connection member 1204. The connection member 1204 may be a land, a ball, a pin, a bump, or the like.

Figure 13:
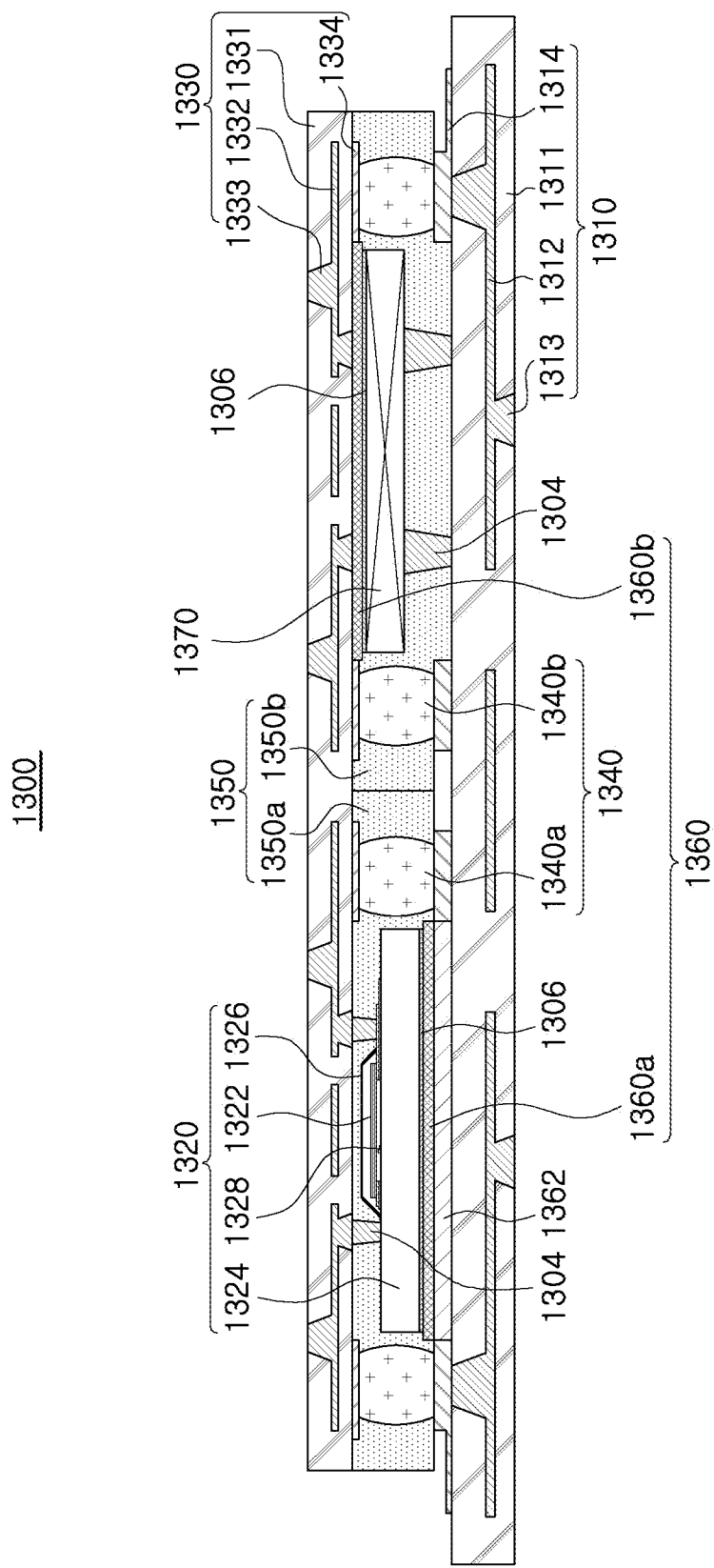
FIG. 13 is a schematic cross-sectional view of a semiconductor package according to an example.

FIG. 13 is a schematic cross-sectional view of a semiconductor package according to an example.

Referring to FIG. 13, a semiconductor package 1300 according to an example may be configured to include, for example, a main substrate 1310, a resonator device 1320, a wiring portion 1330, an electrical connection structure 1340, an encapsulant 1350, a heat dissipation member 1360, and an inductor device 1370.

The main substrate 1310 may include a single crystal such as $LiTaO_3$, $LiNbO_3$, $Li_2B_4O_7$, $SiO_2$, silicon, or the like. Additionally, the main substrate 1310 may include a PZT-based polycrystalline or ZnO thin film. However, the main substrate 1310 is not limited to this example, and may be replaced with various substrates.

The main substrate 1310 may include a first insulating layer 1311, a first wiring layer 1312, disposed inside the first insulating layer 1311, and a first via 1313 connecting the first wiring layer 1312. A first connection pad 1314 may be provided on an upper surface of the main substrate 1310. One end of the electrical connection structure 1340 may be connected to the first connection pad 1314.

The resonator device 1320 is disposed above the main substrate 1310. As an example, the resonator device 1320 may include a resonator device substrate 1324, a resonator portion 1322, mounted on the resonator device substrate 1324, and a protective member 1326 coupled to the resonator device substrate 1324. A cavity 1328 for resonance may be formed between the resonator device substrate 1324 and the resonator portion 1322.

In an example, the resonator device substrate 1324 may be a silicon substrate. For example, a silicon wafer or a silicon on insulator (SOI) type substrate may be used as the resonator device substrate 1324.

As an example, the resonator portion 1322 may include a lower electrode, a piezoelectric layer, and an upper electrode. The lower layer, the piezoelectric layer, and the upper electrode of the resonance portion 1132 may be sequentially laminated.

A protective member 1326 may be disposed to surround the resonator portion 1322 and forms a closed space. Accordingly, the encapsulant 1350 may not flow into the closed space. As an example, the protective member 1326 may include a non-conductive layer.

As an example, the resonator device 1320 may be connected to the wiring portion 1330 via the connection member 1304. The connection member 1304 may be a land, a ball, a pin, a bump, or the like.

The wiring portion 1330 is disposed on one surface of the resonator device 1320 to be connected to the resonator device 1320. As an example, the wiring portion 1330 may include a second insulating layer 1331, a wiring layer 1332, disposed inside the second insulating layer 1331, and a second via 1333 connecting the wiring layer 1332. The second connection pad 1334 may be provided in the wiring portion 1330. One end of the electrical connection structure 1340 may be connected to the second connection pad 1334.

The electrical connection structure 1340 is connected to the wiring portion 1330. As an example, a first end of the electrical connection structure 1340 may be connected to the first connection pad 1314 of the main substrate 1310, and a second end of the electrical connection structure 1340 may be connected to the second connection member 1334 of the wiring portion 1330.

As an example, the electrical connection structure 1340 may be formed of a conductive material, for example, a solder, but this is only an example and a material of the electrical connection structure 1340 is not limited thereto. The electrical connection structure 1340 may be a land, a ball, a pin, a bump, or the like. The electrical connection structure 1340 may be formed to have a multilayer structure or a single-layer structure.

The electrical connection structure 1340 may include a first electrical connection structure 1340a, disposed around the resonator device 1320, and a second electrical connection structure 1340b disposed around the inductor element 1370.

The encapsulant 1350 encapsulates the resonator device 1320, the electrical connection structure 1340, and the inductor element 1370. As an example, the encapsulant 1350 may protect the resonator device 1320 and the inductor device 1370. The form of the encapsulation 1350 is not limited, and may be any form as long as it covers at least a portion of the resonator device 1320 and the inductor device 1370. For example, the encapsulant 1350 may cover at least a portion of the resonator device 1320 and the electrical connection structure 1340.

A material of the encapsulant 1350 is not limited, and may be, for example, an insulating material. In an example, the insulating material may be a thermosetting resin such as an epoxy resin, a thermoplastic resin such as a polyimide resin, or a resin in which a reinforcement such as an inorganic filler is included in the above-described resins, such as an ABF, FR-4, BT, a photoimageable dielectric (PID) resin, and the like. Also, the insulating material may be a well-known molding material such as an EMC. Depending on the example, the insulating material may be a resin in which an insulating resin such as a thermosetting resin or a thermoplastic resin is impregnated in a core material such as an inorganic filler and/or a glass fiber (or a glass cloth or a glass fabric), and the like.

The encapsulant 1350 may include a first encapsulant 1350a, encapsulating the resonator device 1320 and the first electrical connection structure 1340a, and a second encapsulant 1350b encapsulating an inductor device 1370 and a second electrical connection structure 1340b.

The heat dissipation member 1360 is respectively disposed adjacent to the resonator device 1320 and the inductor device 1370. As an example, the heat dissipation member 1360 may be formed of a copper (Cu) material to easily transfer heat, but is not limited thereto. The heat dissipation member 1360 may be mounted on one surface of the resonator device 1320, and one surface of the inductor device 1370 via the bonding material 1306.

The heat dissipation member 1360 may be disposed to be exposed from the encapsulant 1350. The heat dissipation member 1360 transfers heat to the main substrate 1310 via the heat transfer layer 1362. Accordingly, heat, generated from the resonator device 1320 and the inductor element 1370, may be transferred to the main substrate 1310 through the heat dissipation member 1360.

Accordingly, heat dissipation efficiency of the heat, generated from the resonator device 1320 and the inductor element 1370, may be improved.

The heat dissipation member 1360 may include a first heat dissipation member 1360a, connected to the resonator device 1320, and a second heat dissipation member 1360b connected to the inductor element 1370.

The inductor device 1370 may be disposed parallel to the resonator device 1320, and may be electrically connected to the main substrate 1310. As an example, the inductor device 1370 may be connected to the main substrate 1310 via the connection member 1304. The connection member 1304 may be a land, a ball, a pin, a bump, or the like.

As described above, according to an example, heat dissipation efficiency may be improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor package comprising:
   a main substrate;
   a resonator device disposed adjacent to a first surface of the main substrate;
   a wiring portion connected to the resonator device;
   an electrical connection structure connected to the wiring portion and the main substrate;
   an encapsulant encapsulating the resonator device and the electrical connection structure; and
   a heat dissipation member, bonded to the resonator device, and disposed between the resonator device and the main substrate,
   wherein a cavity is provided in the resonator device, and the cavity is formed between a resonance portion of the resonator device and a resonator device substrate provided in the resonator device.

2. The semiconductor package of claim 1, wherein the heat dissipation member is mounted on the resonator device.

3. The semiconductor package of claim 1, wherein the resonator device comprises the resonator device substrate, the resonance portion, and a cap that forms an internal space together with the resonator device substrate.

4. The semiconductor package of claim 3, wherein the resonance portion is mounted on the resonator device substrate.

5. The semiconductor package of claim 1, wherein the heat dissipation member is bonded to a first surface of the resonator device substrate, and is disposed adjacent to one of the main substrate and the wiring portion.

6. The semiconductor package of claim 1, wherein the resonator device is connected to one of the wiring portion and the main substrate through a connection member.

7. The semiconductor package of claim 1, further comprising:
   a dam that prevents the encapsulant from flowing into a space formed between the resonator device and the wiring portion.

8. The semiconductor package of claim 1, wherein the resonator device comprises the resonator device substrate, the resonance portion, and a protective member forming an internal space together with the resonator device substrate.

9. The semiconductor package of claim 1, wherein a plurality of resonator devices is disposed on the main substrate in parallel with each other.

10. The semiconductor package of claim 1, further comprising:
    an electronic device mounted on the wiring portion.

11. The semiconductor package of claim 1, wherein the electrical connection structure is connected to the main substrate through a connection member comprising one of a solder and a copper post.

12. The semiconductor package of claim 1, wherein one of the main substrate and the wiring portion is provided with an inductor pattern that is connected to the resonator device.

13. The semiconductor package of claim 1, further comprising:
    an inductor device connected to one of the main substrate and the wiring portion.

14. The semiconductor package of claim 13, wherein the main substrate is provided with a first connection pad to which the electrical connection structure is connected, and the wiring portion is provided with a second connection pad to which the electrical connection structure is connected.

15. A semiconductor package comprising:
a main substrate;
a resonator device disposed adjacent to a first surface of the main substrate;
a wiring member disposed on one surface of the resonator device to be connected to the resonator device;
an electrical connection structure connected to the wiring member;
an encapsulant encapsulating the resonator device and the electrical connection structure; and
a heat dissipation member bonded to the resonator device and mounted on the resonator device,
wherein the resonator device comprises a resonator device substrate, a resonance portion mounted on the resonator device substrate, and a cap that forms an internal space together with the resonator device substrate,
wherein an inductor pattern is embedded in the cap,
wherein a cavity is formed between the resonance portion and the resonator device substrate, and
wherein the heat dissipation member is disposed between the resonator device and the main substrate.

16. The semiconductor package of claim 15, wherein the cap comprises an insulating layer, a connection conductor embedded in the insulating layer, the inductor pattern, and a protective member that forms an internal space in which the resonance portion is disposed, and
wherein inductor pattern extends from the connection conductor.

17. The semiconductor package of claim 16, wherein the connection conductor is connected to the wiring portion through a connection member.

18. The semiconductor package of claim 15, wherein the heat dissipation member is bonded to a first surface of the resonator device substrate, and is disposed adjacent to the main substrate.

* * * * *